(12) United States Patent
Quenette

(10) Patent No.: US 9,012,957 B2
(45) Date of Patent: Apr. 21, 2015

(54) MOS TRANSISTOR

(71) Applicant: STMicroelectronics S.A., Montrouge (FR)

(72) Inventor: Vincent Quenette, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 22 days.

(21) Appl. No.: 14/017,024

(22) Filed: Sep. 3, 2013

(65) Prior Publication Data

US 2014/0061723 A1 Mar. 6, 2014

(30) Foreign Application Priority Data

Sep. 4, 2012 (FR) ...................................... 12 58240

(51) Int. Cl.
| | | |
|---|---|---|
| *H01L 29/76* | (2006.01) | |
| *H01L 29/78* | (2006.01) | |
| *H01L 29/66* | (2006.01) | |
| *H01L 29/423* | (2006.01) | |

(52) U.S. Cl.
CPC ...... *H01L 29/7813* (2013.01); *H01L 29/66734* (2013.01); *H01L 29/4236* (2013.01); *H01L 29/66787* (2013.01); *H01L 29/66795* (2013.01); *H01L 29/7851* (2013.01)

(58) Field of Classification Search
CPC ................... H01L 27/11582; H01L 27/11556; H01L 29/4236; H01L 29/7813; H01L 29/66787; H01L 29/66795; H01L 29/7851
USPC ......................................... 257/192, 327–332
See application file for complete search history.

(56) References Cited

U.S. PATENT DOCUMENTS

| | | |
|---|---|---|
| 5,391,506 A | 2/1995 | Tada et al. |
| 6,384,456 B1 * | 5/2002 | Tihanyi ......................... 257/401 |
| 2009/0085106 A1 | 4/2009 | Matsunaga |
| 2009/0212375 A1 | 8/2009 | Risaki et al. |
| 2011/0068394 A1 | 3/2011 | Sanada et al. |
| 2013/0248998 A1 * | 9/2013 | Misu et al. ..................... 257/335 |
| 2014/0084359 A1 * | 3/2014 | Tsuchiya et al. .............. 257/327 |

FOREIGN PATENT DOCUMENTS

EP 2 187 431 A1 5/2010

* cited by examiner

*Primary Examiner* — Thanh T Nguyen
(74) *Attorney, Agent, or Firm* — Seed IP Law Group PLLC

(57) ABSTRACT

A MOS transistor including a U-shaped channel-forming semiconductor region and source and drain regions having the same U shape located against the channel-forming region on either side thereof, the internal surface of the channel-forming semiconductor region being coated with a conductive gate, a gate insulator being interposed.

21 Claims, 9 Drawing Sheets

MOS TRANSISTOR

BACKGROUND

1. Technical Field

The present disclosure relates to a MOS transistor and to a MOS transistor manufacturing method.

2. Description of the Related Art

In the field of microelectronic components, it is constantly attempted to improve MOS transistor performances and to increase their integration density in integrated circuit chips. It is especially desired to increase the on-state current and to decrease leakage currents of MOS transistors while decreasing the size thereof.

As MOS transistors miniaturize and their gate length decreases, new effects appear, which especially result in an increase of leakage currents. To attenuate such effects, the doping levels, as well as the thickness and the nature of the gate insulator have had to be adapted, for example, by using a material of higher dielectric permittivity than silicon oxide. However, this uses complex and unreliable techniques.

New MOS transistor structures have also been provided. Among these, MOS transistors formed in SOI-type silicon on-insulator layers sufficiently thin for the gate to act across the entire silicon layer thickness when it is activated have been provided. Such structures are currently called FDSOI ("Fully Depleted Silicon-On-Insulator") in the art. So-called fin structures have also been provided. Such structures provide a better electrostatic control of the channel by the gate. However, they generally have the disadvantage of introducing stray capacitances of non-negligible value as compared with the on-state capacitance between the MOS transistor gate and channel. This causes a decrease of the on-state-to-off-state and back switching speed of the MOS transistor.

BRIEF SUMMARY

A MOS transistor having an increased performance and overcoming some of the disadvantages of the above-described MOS transistor structures is described herein.

An embodiment provides a MOS transistor comprising a U-shaped channel-forming semiconductor region and source and drain regions having the same U shape, located against the channel-forming region on either side thereof, the internal surface of the channel-forming semiconductor region being coated with a conductive gate, a gate insulator being interposed.

According to an embodiment, the internal surfaces of the source and drain regions are coated with an insulating material.

According to an embodiment, the channel-forming region and the source and drain regions are formed in an active area of a semiconductor substrate delimited by insulating trenches.

According to an embodiment, the MOS transistor is formed in a semiconductor layer covering an insulating layer.

According to an embodiment, the source and drain regions are made of a material different from that of the channel-forming region.

According to an embodiment, the gate length of the conductive gate ranges between 5 nanometers and 5 micrometers.

According to an embodiment, the dimension of the bottom of the U-shaped channel-forming region ranges between 0.05 micrometers and 5 micrometers, and the height of the branches of the channel-forming region ranges between 5 nanometers and 5 micrometers.

According to an embodiment, the insulating material covering the internal surfaces of the source and drain regions comprises a material of low dielectric permittivity.

An embodiment further provides a method for manufacturing a MOS transistor in an active area delimited by a ring for insulating a semiconductor layer of a first conductivity type, comprising the steps of forming an opening in the active area to keep first and second parallel semiconductor strips on either side of the opening; filling the opening with a sacrificial material; partially removing the sacrificial material to keep a central strip of sacrificial material extending from the first strip to the second strip perpendicularly to the first and to the second strip; implanting dopant elements in the first and second strips and in the active area to obtain first and second heavily-doped U-shaped regions of the second conductivity type on either side of a third U-shaped doped region of the first conductivity type, the internal surface of the third region being covered with the sacrificial material; coating the internal surfaces of the first and second region with an insulating material; totally removing the sacrificial material; and coating the internal surface of the third region with an insulated conductive gate.

According to an embodiment, the method further comprises a step of siliciding of the first and second regions.

According to an embodiment, the semiconductor layer is the upper portion of a semiconductor substrate.

According to an embodiment, the semiconductor layer is supported by an insulating layer itself supported by a semiconductor substrate.

An embodiment further provides an inverter comprising two MOS transistors of the above-described type.

An embodiment further provides a SRAM comprising six MOS transistors of the above-described type.

According to an embodiment, the MOS transistors of the SRAM have common source and drain regions.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

For clarity, the same elements have been designated with the same reference numerals in the different drawings and, further, as usual in the representation of microelectronic components, the various drawings are not to scale.

DETAILED DESCRIPTION

Figure 1A:
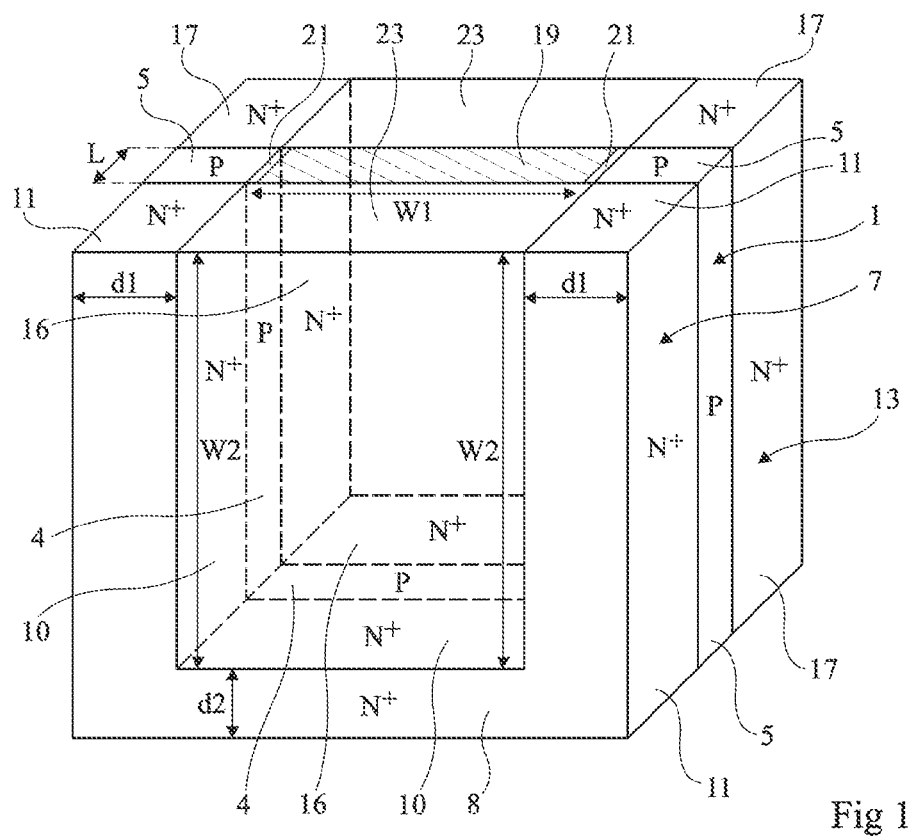
FIGS. 1A and 1B are perspective views schematically showing a MOS transistor.
Figure 1B:
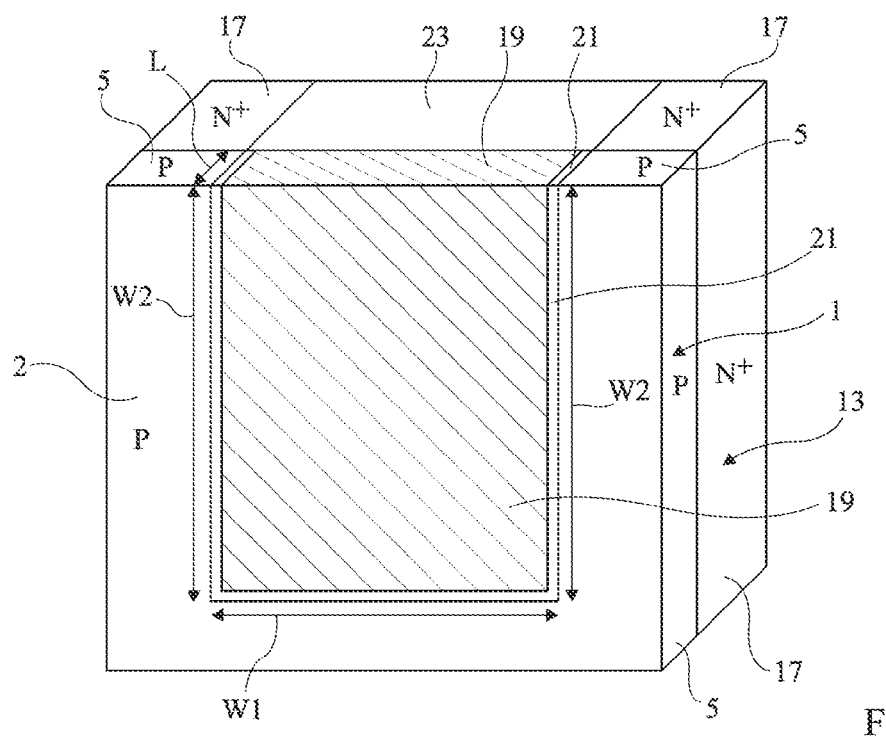
Figure 1C:
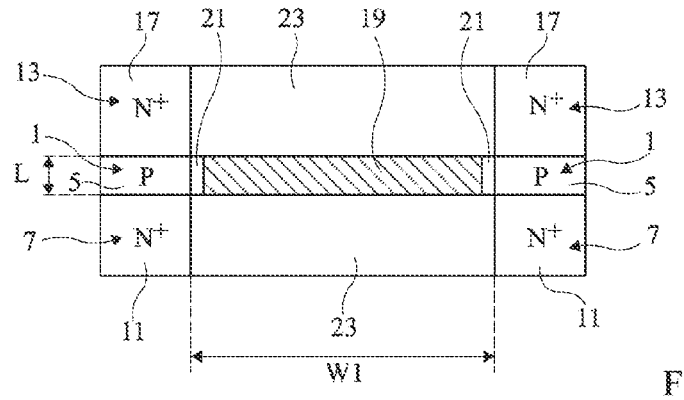
FIG. 1C is a top view corresponding to FIG. 1A.

FIG. 1A is a perspective view schematically showing a MOS transistor. FIG. 1B is a partial view corresponding to FIG. 1A cut at the level of the MOS transistor gate. FIG. 1C is a top view corresponding to FIG. 1A.

A U-shaped region 1 of a semiconductor material, for example, made of silicon, is P-type doped. U-shaped region 1 comprises two main surfaces parallel to the cross-section plane of FIG. 1B. One of the main surfaces, here, surface 2, is the front surface of FIG. 1B. Apart from the main surfaces, region 1 has an internal surface 4 and an external surface 5.

Two U-shaped regions 7 and 13, made of the same semiconductor material as region 1 or of another material, are heavily N-type doped. Like region 1, regions 7 and 13 each comprise two main parallel surfaces. One of the main surfaces of region 7, here, surface 8, is the front surface of FIG. 1A. Region 7 has an internal surface 10 and an external surface 11, and region 13 has an internal surface 16 and an external surface 17. Regions 7 and 13 are located against region 1 on either side thereof.

The opening defined by internal surface 4 of U-shaped region 1 and by planes parallel to the main surfaces of region 1 is filled with a conductive material 19 insulated from internal surface 4 by an insulating layer 21. Conductive material 19 is for example heavily-doped polysilicon or a metallic material. The openings defined by internal surface 10 of U-shaped region 7 and by internal surface 16 of U-shaped region 13 are filled with an insulating material 23. Insulating material 23 for example comprises a material of low dielectric permittivity.

In this MOS transistor, the gate corresponds to conductive material 19 and the gate insulator corresponds to insulating layer 21. The source and drain regions of the MOS transistor correspond to regions 7 and 13.

Under certain biasing conditions for the gate and the source and drain regions, a conduction channel forms in region 1. This conduction channel is U-shaped. Dimension d1 is a width of the branches of U-shaped regions 1, 7, and 13 and dimension d2 is a height of the bottom of these regions. Dimensions d1, d2 may be selected so that, when a nominal voltage is applied to the gate, region 1 is fully depleted.

In such a MOS transistor, the gate length corresponds to thickness L of region 1. Gate width W corresponds to the value of the internal perimeter of the U, that is, W=2W2+W1, with W2 designating the branch height and W1 designating the dimension of the bottom of the U (see FIG. 1B).

Gate length L may range between 5 nm and a few micrometers, for example, between 5 nm and 5 μm, and may for example be on the order of 100 nm. Dimension W1 may range between 0.05 μm and a few micrometers, for example, between 0.05 μm and 5 μm, and for example be on the order of 100 nm. Dimension W2 may range between a few nanometers and a few micrometers, for example, between 5 nm and 5 μm, and for example be on the order of 100 nm.

The structure illustrated in FIG. 1A is formed in the upper portion of a P-type semiconductor substrate and is delimited by insulating trenches. The bottom of the structure, at distance t=W2+d2 from the upper surface of the structure, is supported by a semiconductor layer or, in the case of an SOI-type ("Silicon-On-Insulator") technology, on an insulating layer, or on a semiconductor layer covering an insulating layer.

An advantage of a MOS transistor of the type described in relation with FIGS. 1A to 1C is that, for a given active surface area, effective gate width W of the MOS transistor is much greater than that of a conventional MOS transistor (having a gate width W1).

Another advantage of a MOS transistor of the type described in relation with FIGS. 1A to 1C is that the stray capacitances between the gate and the source and drain regions are decreased.

Another advantage of a MOS transistor of the type described in relation with FIGS. 1A to 1C is due to the fact that the upper surface of this transistor is planar, the surface of gate 19 and that of the U-shaped source and drain regions 7 and 13 being at the same level. The gate, source, and drain contacts of the MOS transistor can then be formed more easily than in the case of a conventional MOS transistor where the upper surface of the gate is located above the upper surface of the source and drain regions. As a result, the connections between several MOS transistors of the type described in relation with FIGS. 1A to 1C are particularly easy to form.

An insulated MOS transistor has been described in relation with FIGS. 1A to 1C. This MOS transistor may be used alone or may form an elementary cell of a multiple-cell assembly of MOS transistors connected in series or in parallel.

Figure 2:
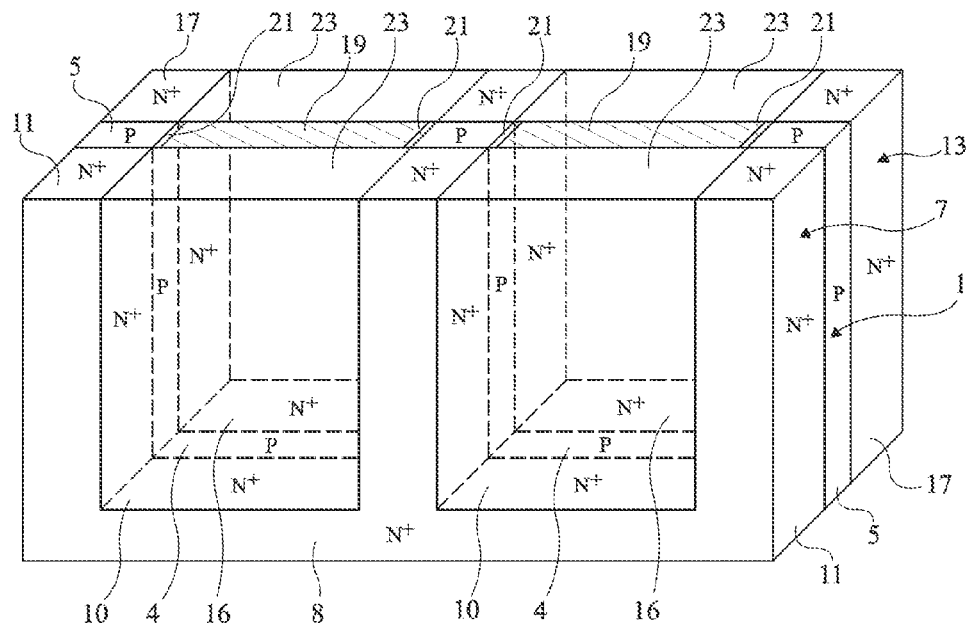
FIG. 2 is a perspective view showing two MOS transistors of the same type in parallel.

FIG. 2 is a perspective view showing an example of two MOS transistors of the type illustrated in FIGS. 1A to 1C adjacent by one of the branches of their U-shaped regions and capable of being connected in parallel.

FIGS. 3A to 3J are cross-section and perspective views schematically illustrating successive steps of a method for manufacturing a MOS transistor of the type illustrated in FIGS. 1A to 1C on a solid substrate.

Figure 3A:
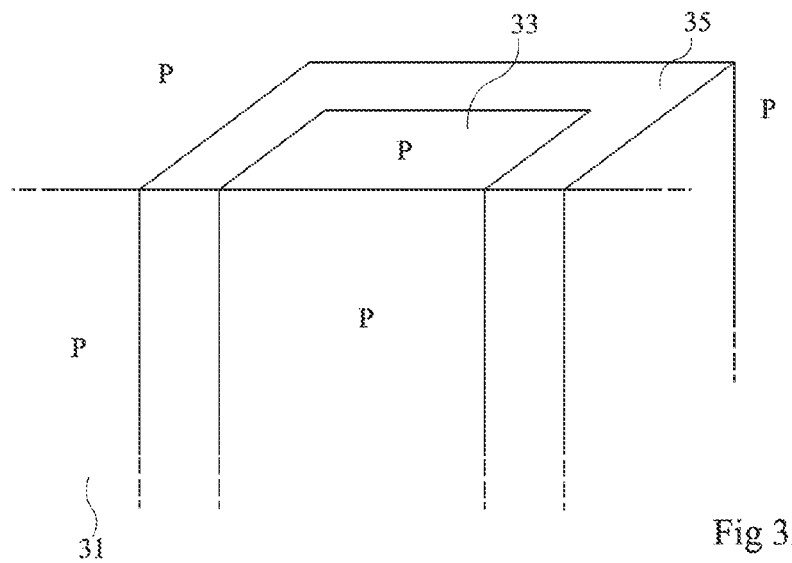
FIGS. 3A to 3J are cross-section and perspective views illustrating successive steps of a method for manufacturing the MOS transistor of FIGS. 1A to 1C.

FIG. 3A shows a portion of a P-type doped semiconductor substrate 31 comprising an active area 33 delimited by an insulating ring 35, for example, made of silicon oxide. The portion of insulating ring 35 located ahead of the cross-section plane is not shown. An embedded insulating layer (not shown) may also delimit active area 33 depthwise to insulate it from the rest of substrate 31.

Figure 3B:
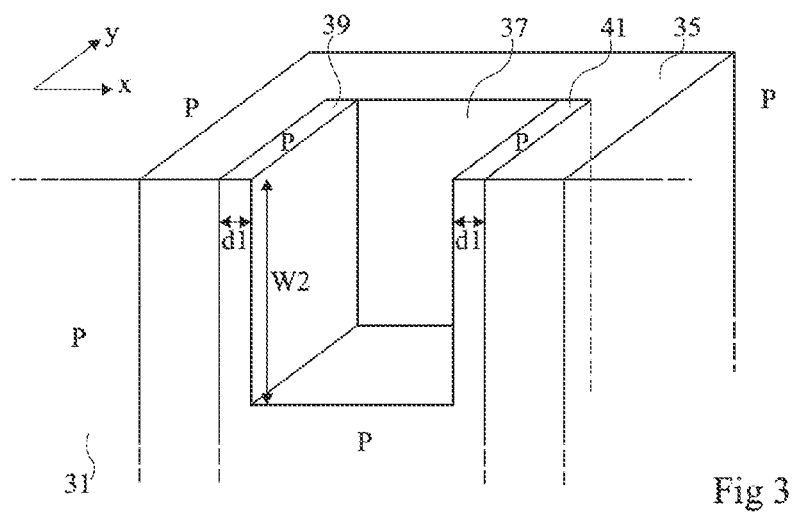

At the step illustrated in FIG. 3B, a parallelepipedal opening 37 has been formed in active area 33 from the upper surface of the substrate. In one of the two plane directions, noted y, the opening has been formed all along the length of active area 33 so that the edges of opening 37 coincide with the internal edges of insulating ring 35. In the perpendicular direction, noted x, opening 37 has been formed across a smaller width than that of active area 33 so that two parallel strips of semiconductor material 39 and 41 of thickness d1 are kept on either side of opening 37. The opening has been formed in substrate 31 to reach a depth W2.

Figure 3C:
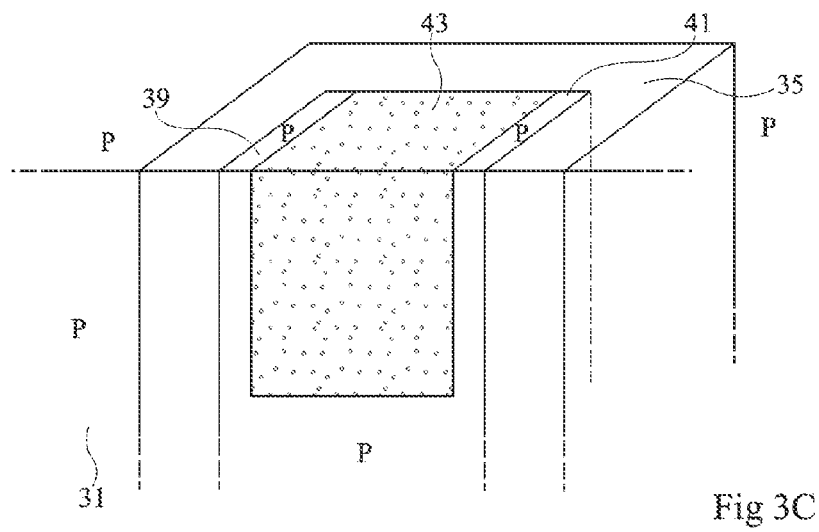

At the step illustrated in FIG. 3C, opening 37 has been filled with a sacrificial material 43, for example, silicon-germanium.

Figure 3D:
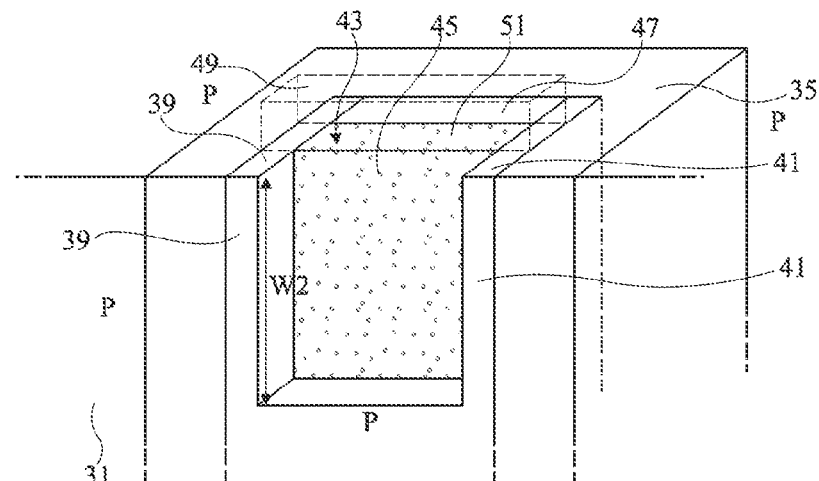

At the step illustrated in FIG. 3D, sacrificial material 43 has been partially removed to only keep a central strip 51 of the sacrificial material extending in direction x from strip 39 to strip 41 of the semiconductor material. To achieve this, a resin strip 49 has been previously arranged above strip 51 of sacrificial material 43 which is not desired to be removed. After the selective and anisotropic etching of sacrificial material 43, two openings 45 and 47 of depth W2 are obtained on either side of sacrificial material strip 51 in direction y.

Figure 3E:
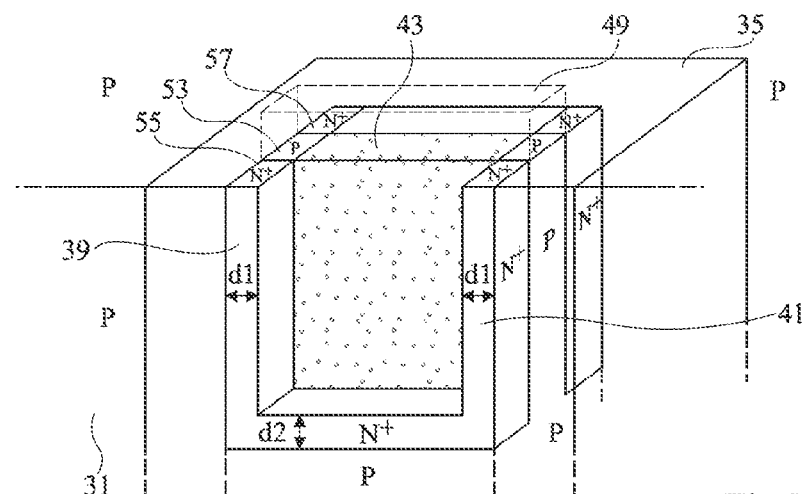

At the step illustrated in FIG. 3E, N-type dopant elements have been implanted in P-type substrate 31, in the portions of strips 39 and 41 of thickness d1 unprotected by resin strip 49 and down to a depth d2 in active area 33 between parallel strips 39 and 41. After implantation, two U-shaped heavily-doped N-type regions 55 and 57 are obtained on either side of a U-shaped P-type doped region 53. Regions 55 and 57 correspond to the source and drain regions of the MOS transistor being formed, and region 53 corresponds to the conduction channel forming region.

Figure 3F:
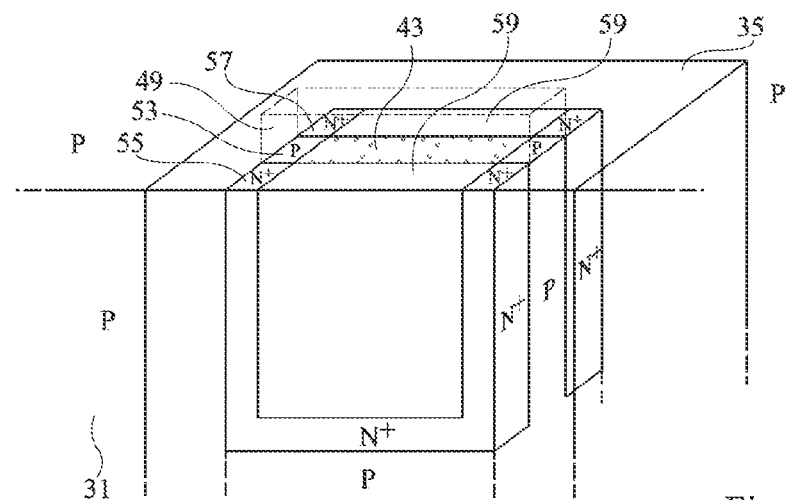

At the step illustrated in FIG. 3F, openings 45 and 47 formed at the step illustrated in FIG. 3D have been filled with an insulating material 59. Insulating material 59 for example comprises a material of low dielectric permittivity. Insulating material 59 may cover the internal surface of regions 55 and 57 and the opposite surfaces of sacrificial material 43 and insulating material 35 without totally filling openings 45 and 47.

Figure 3G:
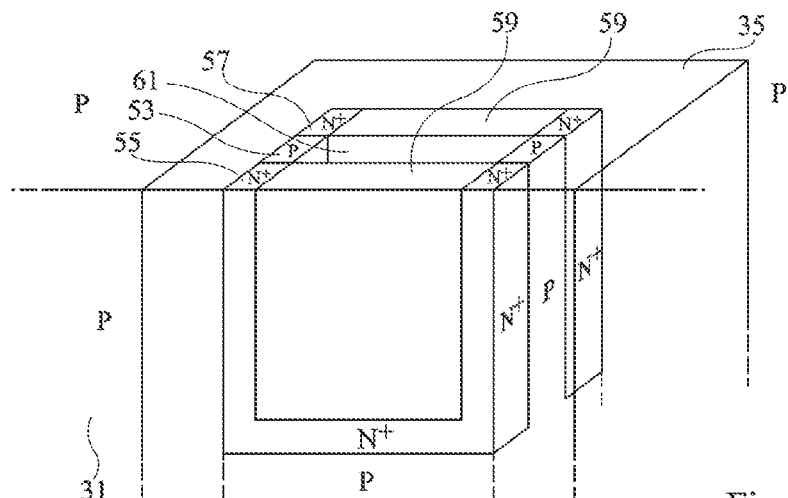

At the step illustrated in FIG. 3G, resin strip 49 and sacrificial material 43 have been removed. A new opening 61 exposing the internal surface of U-shaped region 53 is obtained.

Figure 3H:
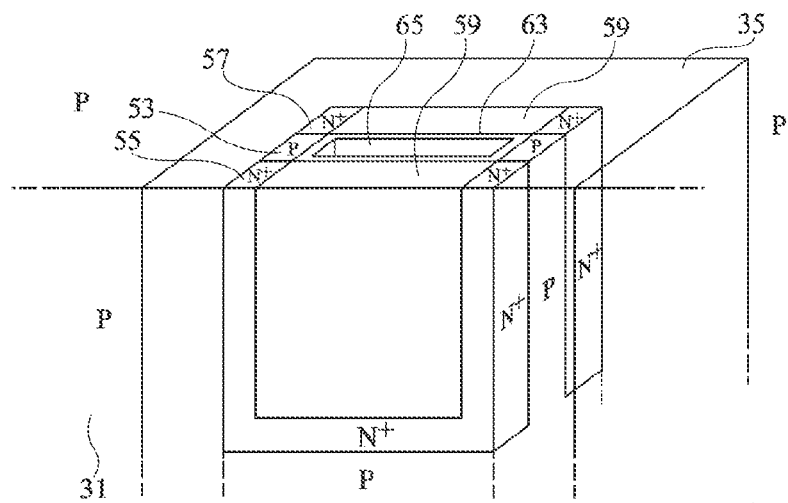

At the step illustrated in FIG. 3H, a thin layer of an insulating material 63 has been formed on the walls and the bottom of opening 61, that is, on the internal surface of region 53 and possibly on the opposite surfaces of insulating material 59. Insulating layer 63 for example is made of a material of high dielectric permittivity, for example, hafnium oxide ($HfO_2$) or zirconium oxide ($ZrO_2$), or of a combination of several materials of high dielectric permittivity. After the forming of thin insulating layer 63, there remains an opening 65.

Figure 3I:
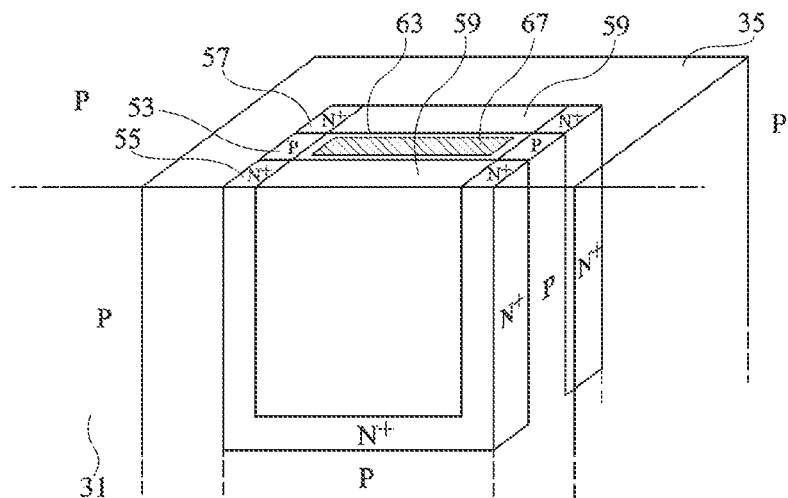

At the step illustrated in FIG. 3I, opening 65 has been filled with a conductive material 67, for example, polysilicon or a metallic material. Conductive material 67 corresponds to the gate of the MOS transistor, and thin insulating layer 63 corresponds to the gate insulator of the MOS transistor. Conductive material 67 may cover the internal surface of region 53 coated with insulating layer 63 without totally filling opening 65.

Figure 3J:
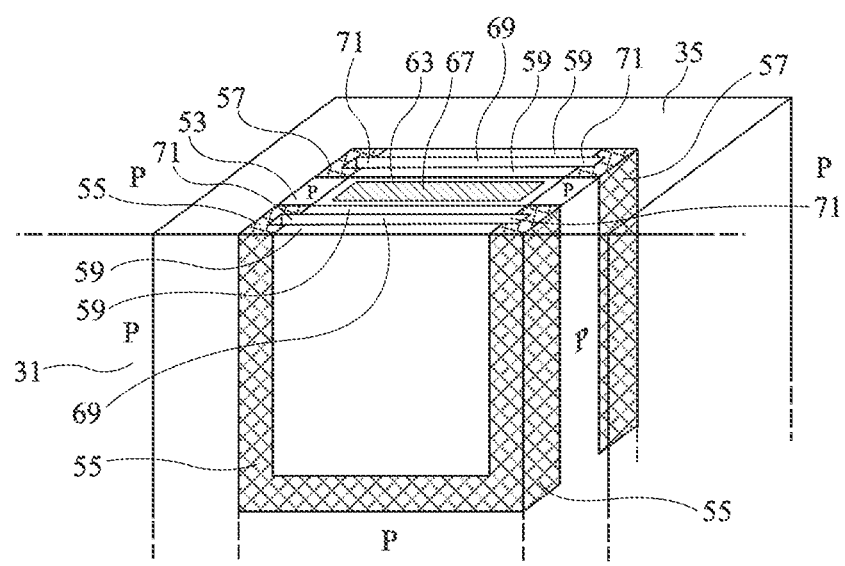

FIG. 3J illustrates an example of an optional step of siliciding of source and drain regions 55, 57. A masking and an etching have been carried out to remove portions of insulating material 59 filling openings 45 and 47 (see FIG. 3D). This removal is performed so that there remain portions of insulating material against conductive material 67 and so that the internal walls of U-shaped source and drain regions 55 and 57 are exposed and possibly slightly hollowed. A metal is then deposited in openings 69, 71 thus formed. Source and drain regions 55, 57 are then at least partially silicided.

Figure 4A:
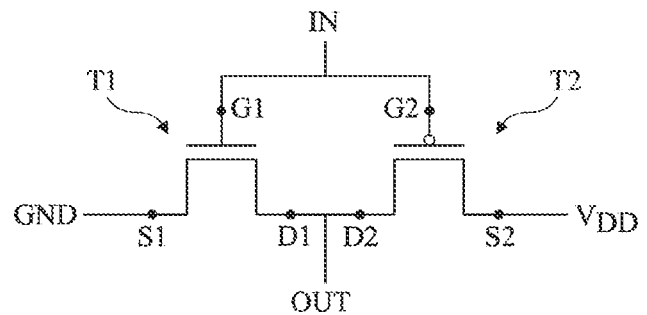
FIGS. 4A and 4B respectively are an electric diagram and a top view showing an inverter formed of two MOS transistors of the type illustrated in FIGS. 1A to 1C.
Figure 4B:
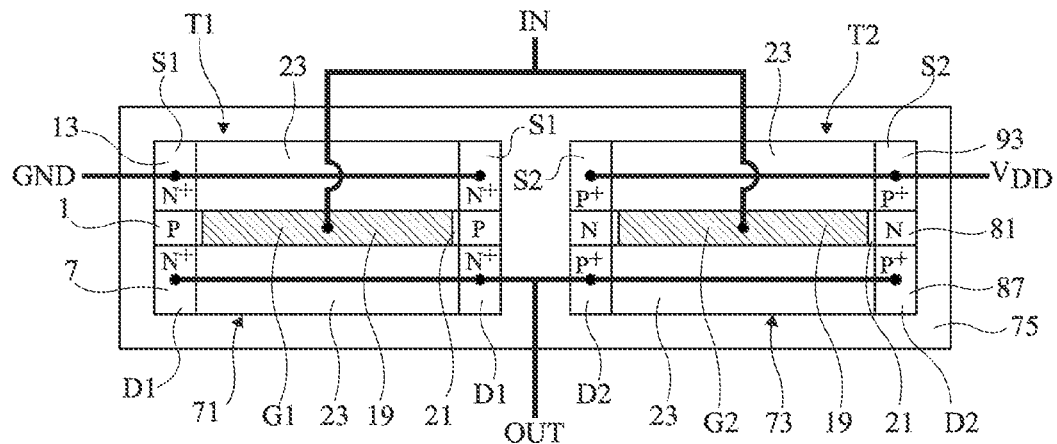
Figure 5A:
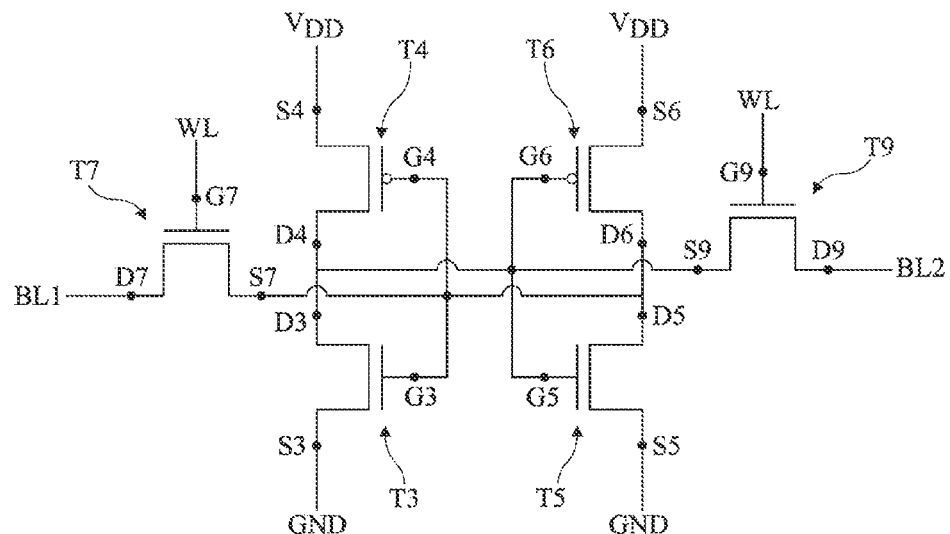
FIGS. 5A and 5B respectively are an electric diagram and a top view showing a SRAM formed of six MOS transistors of the type illustrated in FIGS. 1A to 1C.
Figure 5B:
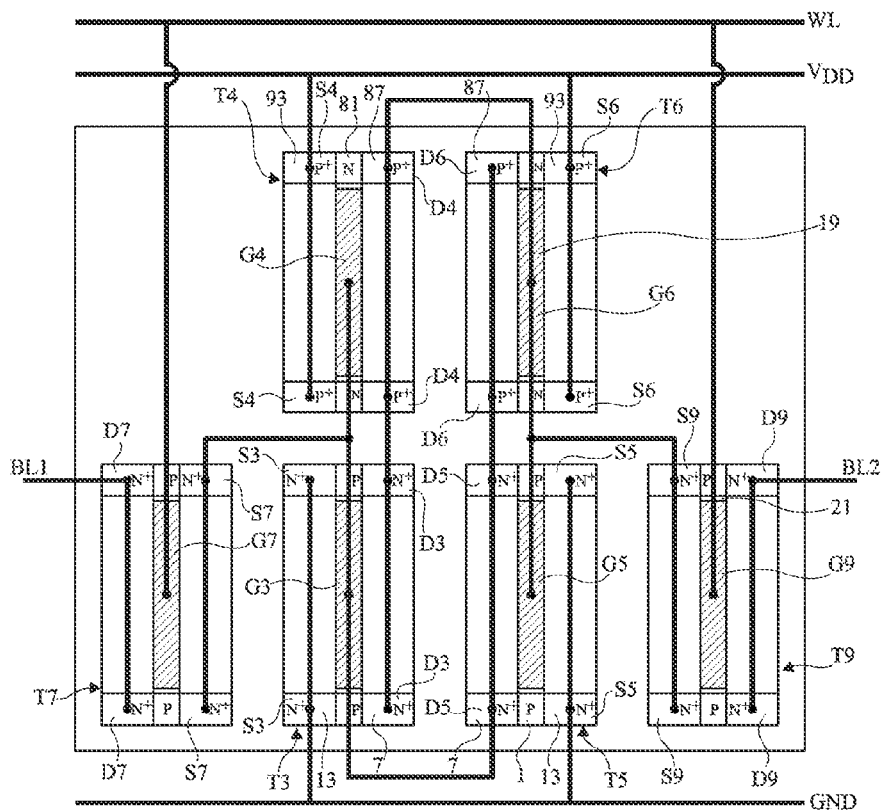
Figure 6:
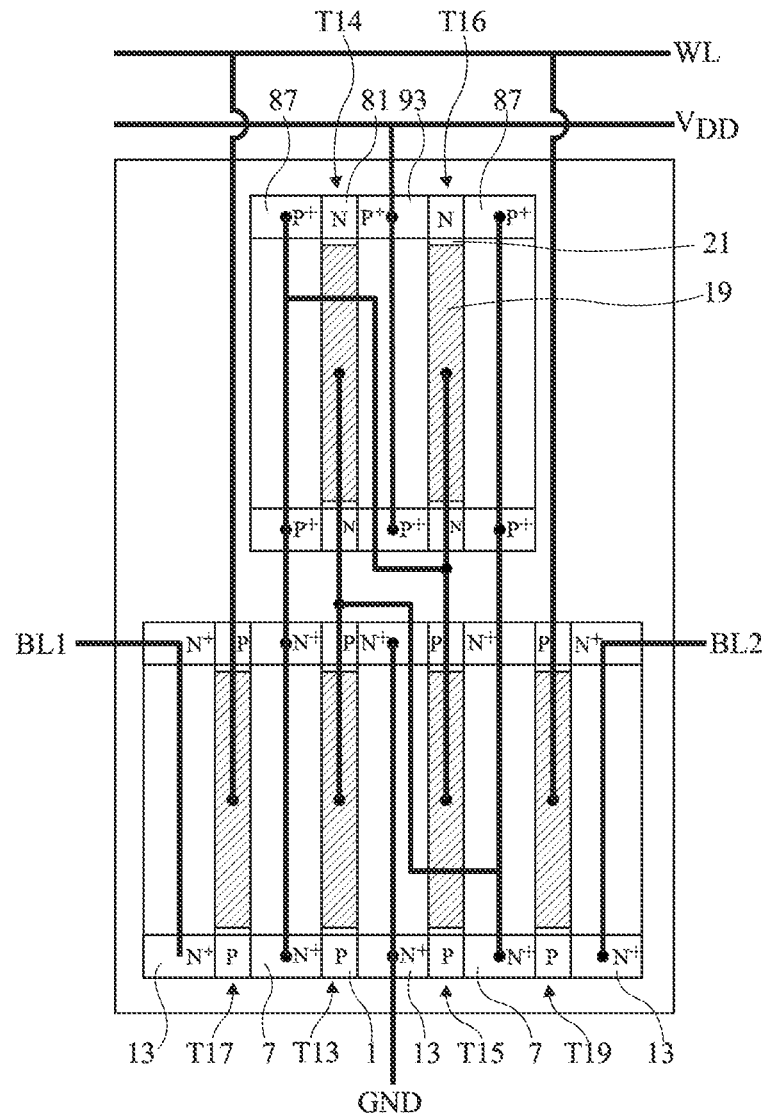
FIG. 6 is a top view schematically showing an alternative SRAM formed of six MOS transistors of the type illustrated in FIGS. 1A to 1C.

Transistors of the above type are particularly simple to interconnect, as illustrated in FIG. 4B in the case of an inverter and in FIGS. 5B and 6 in the case of a SRAM with six transistors.

FIGS. 4A and 4B respectively are an electric diagram and a top view showing an inverter formed of two MOS transistors, each of which is of the previously-described type.

FIG. 4A shows an inverter comprising an N-channel MOS transistor T1 and a P-channel MOS transistor T2. Source S1, drain D1, and gate G1 the gate of transistor T1, and source S2, drain D2, and gate G2 of transistor T2.

In the embodiment illustrated in FIG. 4B, MOS transistors T1 and T2 have the same structure as the MOS transistor illustrated in top view in FIG. 1C. All conductivity types are inverted for MOS transistor T2. The channel-forming region of MOS transistor T2 is designated with reference numeral 81, and its drain and source regions are designated with reference numerals 87 and 93. MOS transistors T1 and T2 have respectively been formed in active areas 71 and 73 of a semiconductor substrate.

Source region 13 (S1) of transistor T1 is connected to ground (GND). Source 93 (S2) of transistor T2 is connected to a positive voltage $V_{DD}$. Gates 19 (G1, G2) of transistors T1 and T2 are interconnected and connected to input IN of the inverter. Drain region 7 (D1) of transistor T1 and drain region 87 (D2) of transistor T2 are interconnected and connected to output OUT of the inverter.

The conductive tracks of interconnection of MOS transistors T1 and T2 are shown in thick lines in FIG. 4B. Since the upper surface of MOS transistors T1 and T2 is planar, these connections are particularly simple.

FIGS. 5A and 5B respectively are an electric diagram and a top view showing a SRAM ("Static Random Access Memory") formed of six MOS transistors, each of which is of the previously-described type.

As illustrated in FIG. 5A, the SRAM comprises four N-channel MOS transistors T3, T5, T7, T9 and two P-channel MOS transistors T4, T6. Source Si, drain Di, and gate Gi of transistor Ti (i being equal to 3, 4, 5, 6, 7 or 9).

As illustrated in FIG. 5B, P-channel MOS transistors T4 and T6 are arranged side by side above N-channel MOS transistors T7, T3, T5, T9, which are also side by side.

Source regions 13 (S3 and S5) of N-channel transistors T3 and T5 are grounded. Source regions 93 (S4 and S6) of P-channel transistors T4 and T6 are connected to a positive voltage $V_{DD}$. Drain regions 7 (D3) of transistor T3 and 87 (D4) of transistor T4 are interconnected and are connected to gates 19 (G5, G6) of transistors T5 and T6, which are themselves interconnected. Similarly, drain regions 7 (D5) of transistor T5 and 87 (D6) of transistor T6 are interconnected and are connected to gates 19 (G3, G4) of transistors T3 and T4, which are themselves interconnected.

Gates 19 (G3, G4) of transistors T3 and T4 are connected to source S7 of transistor T7. Gates 19 (G5, G6) of transistors T5 and T6 are connected to source S9 of transistor T9. Drain D7 of transistor T7 and drain D9 of transistor T9 are respectively connected to bit lines BL1 and BL2 ("bitlines"). Gates 19 (G7, G9) of transistors T7 and T9 are connected to a word line WL ("wordline").

The conductive tracks of interconnection of MOS transistors T3, T4, T5, T6, T7, T9 are shown in thick lines in FIG. 5B. Since the upper surface of the different MOS transistors is planar, such connections are particularly simple.

FIG. 6 is a top view schematically showing an alternative SRAM formed of six MOS transistors, each of which is of the previously-described type. In this variation, the SRAM is formed of four N-channel MOS transistors T13, T15, T17, T19 side by side and of two P-channel MOS transistors T14, T16 side by side, the MOS transistors having common source and drain regions. The P-channel MOS transistors are arranged above the N-channel MOS transistors.

N-channel transistors T13 and T15 have a common drain region 13, this drain region being grounded. P-channel transistors T14 and T16 have a common drain region 93, this drain region being connected to a voltage $V_{DD}$. Transistors T13 and T17 have a common source region 7, and transistors T15 and T19 have a common source region 7.

Source regions 7 of transistor T13 and 87 of transistor T14 are interconnected and are connected to gates 19 of transistors T15 and T16, which are themselves interconnected. Since source region 7 of transistor T13 also is the source region of transistor T17, gates 19 of transistors T15 and T16 are also connected to the source of transistor T17. Similarly, source regions 7 of transistor T15 and 87 of transistor T16 are interconnected and are connected to gates 19 of transistors T13 and T14, which are themselves interconnected. Gates 19 of transistors T13 and T14 are also connected to the source of transistor T19. Drain 13 of transistor T17 and that of transistor T19 are respectively connected to bit lines BL1 and BL2. Gates 19 of transistors T17 and T19 are connected to a word line WL.

An advantage of a SRAM of the type illustrated in FIG. 6 is that, since the MOS transistors have common source and drain regions, the number of connections between MOS transistors is decreased, as well as the surface area taken up by the memory. Further, just like for the SRAM illustrated in FIG. 5B, the conductive tracks of interconnection of the MOS transistors, shown in thick lines, are particularly simple since the upper surface of the transistors is planar.

Specific embodiments have been described. Various alterations, modifications, and improvements will occur to those skilled in the art. In particular, although MOS transistors formed in a P-type doped semiconductor substrate have been described, the MOS transistors may of course be formed in an N-type doped semiconductor substrate.

Conductive material 19 forming the MOS transistors gates may be different for the N-channel MOS transistors and for the P-channel MOS transistors. Conductive material 19 may be formed of a stack of different conductive materials.

Although a MOS transistor comprising source and drain regions and a channel-forming region made of a same semiconductor material has been described, the source and drain regions may be made of a metallic material, for example formed by a siliciding step.

Although a MOS transistor formed in a solid semiconductor substrate has been described, the MOS transistor may of course be formed in the upper semiconductor layer of a silicon-on-insulator type substrate (SOI). U-shaped regions 1, 7, and 13 of a MOS transistor of the type illustrated in FIGS. 1A to 1C will then be formed in the upper semiconductor layer of the SOI substrate.

Although a MOS transistor manufacturing method using a silicon-germanium sacrificial material has been described, any material capable of being selectively etched over insulating material 59 and over the semiconductor material of the solid substrate or of the upper layer of the SOI-type substrate where the MOS transistor is formed may of course be used.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A MOS transistor, comprising:
a channel-forming semiconductor region having a U shape, the channel-forming semiconductor region having an internal surface;
source and drain regions having the same U shape positioned on each side of the channel-forming region;
a conductive gate adjacent to the internal surface of the channel-forming semiconductor region; and
a gate insulator positioned between the conductive gate and the internal surface of the channel-forming semiconductor region.

2. The MOS transistor of claim 1 wherein the source and drain regions have internal surfaces that are coated with an insulating material.

3. The MOS transistor of claim 2 wherein the insulating material is a material of low dielectric permittivity.

4. The MOS transistor of claim 1 wherein the channel-forming region and the source and drain regions are formed in an active area of a semiconductor substrate delimited by insulating trenches.

5. The MOS transistor of claim 1 wherein the channel-forming region is formed in a semiconductor layer covering an insulating layer.

6. The MOS transistor of claim 1 wherein the source and drain regions are of a material different from a material of the channel-forming region.

7. The MOS transistor of claim 1 wherein a length of the conductive gate is in the range of 5 nanometers and 5 micrometers.

8. The MOS transistor of claim 1 wherein the channel-forming region includes a bottom and branches that extend from the bottom, a width of the bottom of the channel-forming region is in the range of 0.05 micrometers and 5 micrometers, and a height of the branches of the channel-forming region is in the range of 5 nanometers and 5 micrometers.

9. A method, comprising:
manufacturing a MOS transistor in an active area of a semiconductor layer that is delimited by a ring for insulating a region of a first conductivity type, the manufacturing including:
forming an opening in the active area;
forming first and second parallel semiconductor strips on each side of the opening;
filling the opening with a sacrificial material;
forming a central strip of sacrificial material by partially removing the sacrificial material, the central strip extending from the first strip to the second strip;
forming first and second heavily-doped U-shaped regions of the second conductivity type by implanting dopant elements in the first and second strips and in the active area;
forming a third U-shaped doped region of the first conductivity type, the first and second heavily-doped U-shaped regions being on either side of the third U-shaped doped region;
covering an internal surface of the third region with the sacrificial material;
coating internal surfaces of the first and second regions with an insulating material;
totally removing the sacrificial material; and
coating the internal surface of the third region with an insulated conductive gate.

10. The method of claim 9, further comprising siliciding the first and second regions.

11. The method of claim 9 wherein the semiconductor layer is an upper portion of a semiconductor substrate.

12. The method of claim 9 wherein the semiconductor layer is supported by an insulating layer that is supported by a semiconductor substrate.

13. The method of claim 9 wherein the central strip is perpendicular to the first and second strip.

14. A device, comprising:
a first MOS transistor; and
a second MOS transistor coupled to the first MOS transistor, each of the first and second transistors including:
a channel-forming semiconductor region having a U shape, the channel-forming semiconductor region having an internal surface;
source and drain regions having the same U shape positioned on each side of the channel-forming region;
a conductive gate adjacent to the internal surface of the channel-forming semiconductor region; and a gate insulator positioned between the conductive gate and the internal surface of the channel-forming semiconductor region.

15. The inverter device of claim 14, further comprising a ground terminal, a voltage terminal, an input terminal, and an output terminal, the gate of the first transistor and the second transistor are both coupled to the input terminal, the drain regions of the first transistor and the second transistor are both coupled to the output terminal, the source region of the first transistor is coupled to the ground terminal, and the source region of the second transistor is coupled to the voltage terminal.

16. The device of claim 14 wherein the first and second MOS transistors are coupled to form an inverter.

17. A device, comprising:
two MOS transistors of a first conductivity type;
four MOS transistors of a second conductivity type, each one of the two MOS transistors of the first conductivity type and the four MOS transistors of the second conductivity type include:
a first U-shaped semiconductor region having a first surface opposite to a second surface;
a U shaped semiconductor source region adjacent to the first surface of the first U-shaped semiconductor region;
a U-shaped semiconductor drain region adjacent to the second surface of the first U-shaped semiconductor region;
a conductive gate region within the first U-shaped semiconductor region;
a first insulating region within the U-shaped semiconductor source region; and
a second insulating region within the U-shaped semiconductor drain region.

18. The device of claim 17 wherein each transistor includes an insulating layer between the conductive gate region and the first U-shaped semiconductor region.

19. The device of claim 17, wherein the two MOS transistors and the four MOS transistor are coupled together to form a static random access memory.

20. The device of claim 17 wherein:
the two MOS transistors of the first conductivity type have common drain regions;
a first and second MOS transistor of the second conductivity type have common drain regions, and
a third and fourth MOS transistor of the second conductivity type have cannon source regions.

21. The device of claim 19, further comprising a wordline, a first bit line, a second bit line, a ground terminal, and a voltage terminal.

* * * * *

UNITED STATES PATENT AND TRADEMARK OFFICE
CERTIFICATE OF CORRECTION

| | | |
|---|---|---|
| PATENT NO. | : 9,012,957 B2 | Page 1 of 1 |
| APPLICATION NO. | : 14/017024 | |
| DATED | : April 21, 2015 | |
| INVENTOR(S) | : Vincent Quenette | |

It is certified that error appears in the above-identified patent and that said Letters Patent is hereby corrected as shown below:

In the Claims

Column 9, Line 4:
"15. The inverter device of claim 14, further comprising a" should read as, --15. The device of claim 14, further comprising a--.

Column 9, Line 23:
"a U shaped semiconductor source region adjacent to the" should read as, --a U-shaped semiconductor source region adjacent to the--.

Column 10, Line 20:
"conductivity type have common drain regions, and" should read as, --conductivity type have common drain regions; and--.

Column 10, Line 22:
"conductivity type have cannon source regions." should read as, --conductivity type have common source regions.--.

Signed and Sealed this
Twenty-seventh Day of October, 2015

Michelle K. Lee
*Director of the United States Patent and Trademark Office*